(12) United States Patent
Sekine et al.

(10) Patent No.: US 10,134,492 B2
(45) Date of Patent: Nov. 20, 2018

(54) DEVICE FOR QUANTUM BEAM GENERATION, METHOD FOR QUANTUM BEAM GENERATION, AND DEVICE FOR LASER FUSION

(71) Applicants: HAMAMATSU PHOTONICS K.K., Hamamatsu-shi, Shizuoka (JP); The Graduate School for the Creation of New Photonics Industries, Hamamatsu-shi, Shizuoka (JP); TOYOTA JIDOSHA KABUSHIKI KAISHA, Toyota-shi, Aichi (JP)

(72) Inventors: Takashi Sekine, Hamamatsu (JP); Toshiyuki Kawashima, Hamamatsu (JP); Nakahiro Satoh, Hamamatsu (JP); Yoneyoshi Kitagawa, Hamamatsu (JP); Yoshitaka Mori, Hamamatsu (JP); Katsuhiro Ishii, Hamamatsu (JP); Ryohei Hanayama, Hamamatsu (JP); Osamu Komeda, Toyota (JP); Yasuhiko Nishimura, Toyota (JP); Mitsutaka Kakeno, Nagakute (JP)

(73) Assignees: HAMAMATSU PHOTONICS K.K., Hamamatsu-shi, Shizuoka (JP); TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 574 days.

(21) Appl. No.: 14/646,765

(22) PCT Filed: Oct. 4, 2013

(86) PCT No.: PCT/JP2013/077120
§ 371 (c)(1),
(2) Date: May 22, 2015

(87) PCT Pub. No.: WO2014/083940
PCT Pub. Date: Jun. 5, 2014

(65) Prior Publication Data
US 2015/0294744 A1    Oct. 15, 2015

(30) Foreign Application Priority Data
Nov. 27, 2012   (JP) .............................. 2012-258815

(51) Int. Cl.
*G21B 1/23* (2006.01)
*G03F 7/20* (2006.01)
(Continued)

(52) U.S. Cl.
CPC .......... *G21B 1/23* (2013.01); *G03F 7/70033* (2013.01); *G21K 5/04* (2013.01); *G21K 5/10* (2013.01); *H05G 2/008* (2013.01)

(58) Field of Classification Search
CPC ........ H05G 2/008; H05G 2/003; H05G 2/006; G03F 7/70033; G21B 1/23
See application file for complete search history.

(56) References Cited

U.S. PATENT DOCUMENTS 7,405,413 B2 * 7/2008 Hergenhan ............. H05G 2/003
250/492.2
7,608,846 B2 * 10/2009 Nakano .................. H05G 2/005
250/493.1
(Continued)

FOREIGN PATENT DOCUMENTS

CN    1461976    12/2003
CN    1701897    11/2005
(Continued)

OTHER PUBLICATIONS

English-language translation of International Preliminary Report on Patentability (IPRP) dated Jun. 11, 2015 that issued in WO Patent Application No. PCT/JP2013/077120.
(Continued)

*Primary Examiner* — Wyatt Stoffa
(74) *Attorney, Agent, or Firm* — Drinker Biddle & Reath LLP

(57) ABSTRACT

The device has a target supply unit 4a for supplying a target 2a to a chamber 3a, a target monitor 5a for monitoring the target 2a present inside the chamber 3a, a laser light irradiator 6a for irradiating the target 2a present inside the chamber 3a, with laser light 8a, and a controller 7a. The target supply unit 4a emits the target 2a at a timing for emitting, that is controlled by the controller 7a, into a preset emission direction 3d inside the chamber 3a, and the controller 7a calculates an irradiation point 4d with the laser light 8a, calculates a timing for arriving of the target 2a at the irradiation point 4d, and makes the laser light irradiator 6a irradiate the target with the laser light, based on the irradiation point 4d and the timing for arriving.

2 Claims, 4 Drawing Sheets (51) Int. Cl.
*H05G 2/00* (2006.01)
*G21K 5/04* (2006.01)
*G21K 5/10* (2006.01)

(56) References Cited

U.S. PATENT DOCUMENTS

| | | | | |
|---|---|---|---|---|
| 8,502,178 | B2* | 8/2013 | Moriya | H05G 2/008 250/504 R |
| 9,390,827 | B2* | 7/2016 | Partlo | G03F 7/70033 |
| 2004/0200977 | A1* | 10/2004 | Rieger | G03F 7/70033 250/398 |
| 2006/0024216 | A1* | 2/2006 | Hergenhan | H05G 2/003 422/186.3 |
| 2006/0203965 | A1* | 9/2006 | Zink | H05G 2/003 378/119 |
| 2007/0158597 | A1* | 7/2007 | Fomenkov | B82Y 10/00 250/504 R |
| 2007/0170377 | A1* | 7/2007 | Nakano | H05G 2/003 250/504 R |
| 2008/0067456 | A1 | 3/2008 | Kloepfel et al. | |
| 2009/0095925 | A1* | 4/2009 | Ershov | H05G 2/003 250/504 R |
| 2011/0196648 | A1* | 8/2011 | Mayer | G01D 5/3473 702/151 |
| 2012/0175533 | A1* | 7/2012 | Moriya | H05G 2/003 250/504 R |
| 2012/0228525 | A1* | 9/2012 | Moriya | H05G 2/003 250/504 R |

FOREIGN PATENT DOCUMENTS

| | | |
|---|---|---|
| JP | S52-17789 A | 2/1977 |
| JP | 2007-088267 A | 4/2007 |
| JP | 2007-288190 A | 11/2007 |
| JP | 2009-539117 | 11/2009 |

OTHER PUBLICATIONS

Takayoshi Norimatsu et al, "Design of Target Fabrication and Injection System," J. Plasma Fusion Res., 2006, pp. 829-835, vol. 82, No. 12, including partial English translation.
General Atomics, "Inertial Fusion Energy," IFT Catalog, pp. 11-1-11-4, URL:http://www.ga.com/media/GA/energy/IFT_Catalog.pdf.
Sudo Shigeru et al., "Tracer-encapsulated solid pellet injection system", Review of Scientific Instruments, vol. 83, No. 2, Feb. 1, 2012, p. 23503-1-p. 23503-6, XP012161850.

* cited by examiner

DEVICE FOR QUANTUM BEAM GENERATION, METHOD FOR QUANTUM BEAM GENERATION, AND DEVICE FOR LASER FUSION

TECHNICAL FIELD

The present invention relates to a device for quantum beam generation, a method for quantum beam generation, and a device for laser fusion.

BACKGROUND ART

Patent Literature 1 discloses a system for extracting energy from a controlled fusion reaction. This system includes a target chamber for receiving a fusion target material. A plurality of energy drivers are arranged around the target chamber so as to supply energy to the target material in the target chamber to initiate the controlled fusion reaction, releasing energy in the forms of fusion plasma and heat. The system is provided with a plurality of structures for extracting energy from the fusion reaction. These structures have devices to extract high-voltage electric current power from the fusion plasma; and means to extract thermal energy from the target chamber. Power to the energy drivers can be supplied from the high-voltage DC power extracted from the fusion reaction. The energy drivers use an apodizing filter to impart a desired shape to the wavefront of the driving energy for causing the fusion reaction, in order to avoid hydrodynamic instability.

Patent Literature 2 discloses a laser plasma EUV light source for irradiating a target with laser light to plasmanize the target and extracting EUV light generated on that occasion, as output. This laser plasma EUV light source uses a platelike target in a size approximately equal to a focused diameter of the laser light, as the target. The target is ejected with a direction of a disc aligned, from a nozzle having a slit-shaped aperture. The target is conveyed on a gas stream. He (helium) gas is used in this example. Since the exterior of the nozzle is maintained in a high vacuum, the target ejected from the nozzle reaches an irradiation position with the laser light, while keeping its posture unchanged. In synchronism with the supply of the target, pulsed laser light from an Nd:YAG laser light source is focused by a lens to be applied onto the target. The spot diameter of the laser is the same as the diameter of the target, 1 mm, and the thickness thereof is not more than 1000 nm. Therefore, almost the entire target is plasmanized, while inhibiting generation of debris and enhancing conversion efficiency.

Non Patent Literature 1 discloses a technology using a long target acceleration mechanism of a linear sabot type and air gun type. Non Patent Literature 2 discloses a technology of a target acceleration mechanism of a sabot type.

CITATION LIST

Patent Literature

Patent Literature 1: Japanese Translation of PCT International Application Publication No. 2009-539117
Patent Literature 2: Domestic Re-publication of PCT International Application No. 2006/075535

Non Patent Literature

Non Patent Literature 1: NORIMATSU Takayoshi, ENDO Takuma, YOSHIDA Hiroki, and IWAMOTO Akifumi, "4. Design of Target Fabrication and Injection System," J. Plasma Fusion Res. Vol. 82, No. 12 (2006) 829-835
Non Patent Literature 2: Catalog of GENERAL ATOMICS, "IFT Catalog," "11. INERTIAL FUSION ENERGY," URL:http://www.ga.com/media/GA/energy/IFT_Catalog.pdf

SUMMARY OF INVENTION

Technical Problem

The conventional devices for quantum beam generation as described above are not ones that can automatically continuously generate a quantum beam. Therefore, one of objects of the present invention, while having been accomplished in view of the above circumstances, is to provide a device for quantum beam generation, a method for quantum beam generation, and a device for laser fusion enabling automatic, continuous quantum beam generation, for example.

Solution to Problem

A device for quantum beam generation according to one aspect of the present invention is one comprising: a chamber for a target to induce a quantum beam generation reaction; a target supply unit that supplies the target to the chamber; a target monitor that monitors the target present inside the chamber; a laser light irradiator that irradiates the target present inside the chamber, with laser light; and a controller that controls the target supply unit and the laser light irradiator, based on the result of the monitoring by the target monitor, wherein the target supply unit comprises an emission port that emits the target, and emits the target at a timing for emitting, that is controlled by the controller, into a preset emission direction inside the chamber from the emission port, wherein the target monitor comprises a position detector and a time detector, wherein the position detector detects a passing position of the target in a monitoring area and sends position information indicative of the passing position, to the controller, wherein the monitoring area is preliminarily set at a position where the monitoring area intersects with the emission direction inside the chamber, wherein the passing position indicates a position in a plane perpendicular to the emission direction, wherein the time detector measures an entrance time when the target enters the monitoring area and an exit time when the target exits the monitoring area, and sends entrance time information indicative of the entrance time and exit time information indicative of the exit time, to the controller, wherein the laser light irradiator comprises a laser light output unit and a condensing optical unit, wherein the laser light output unit outputs laser light under control of the controller, wherein the condensing optical unit condenses the laser light output from the laser light output unit, based on control by the controller, wherein the controller calculates an irradiation point with the laser light, using the position information, sends condensing control information based on the irradiation point to the condensing optical unit, calculates a timing for arriving of the target at the irradiation point, using a width of the monitoring area, the entrance time information, the exit time information, and a distance from the monitoring area to the irradiation point, and sends laser control information based on the timing for arriving, to the laser light output unit, wherein the condensing control information is information for controlling the condensing optical unit so as to condense the laser light from the laser light output unit to the irradiation point, and wherein the laser control information is information for controlling the laser light output unit so as to output the laser light at the timing for arriving. In this manner, the target supply unit supplies the target to induce the quantum beam generation reaction, at the timing for emitting, that is controlled by the controller, to the inside of the chamber, the target monitor monitors motion of the target inside the chamber, and the controller implements the irradiation of the target with the laser light, based on the result of this monitoring. Therefore, the controller automatically implements the supply of the target and the irradiation of the target with the laser light, whereby continuous quantum beam generation is enabled by the control by the controller.

In the device for quantum beam generation according to the one aspect of the present invention, the controller controls the target supply unit so as to sequentially emit a plurality of the targets at periodic intervals from the emission port. Therefore, periodic continuous quantum beam generation is enabled by the control by the controller.

In the device for quantum beam generation according to the one aspect of the present invention, the target supply unit comprises a support table, a disc, a tank, and a driver; the support table comprises a principal surface, a back surface, and an emission hole; the emission hole has a diameter enough for the target to pass, has the emission port, and penetrates from the principal surface to the back surface; the disc comprises a plurality of through holes at preset intervals along an edge of the disc; a center of the disc is held rotatable with respect to the principal surface so that the through holes can overlap with the emission hole; the through holes can enclose the targets on the principal surface; the tank comprises a main body and a supply tube and is arranged above the disc; the main body can store a plurality of the targets; the supply tube has a diameter enough for the target to pass, is connected to the main body, and is arranged above a circumference passing centers of all the through holes; the driver comprises a rotary shaft and a motor; the rotary shaft is fixed to the disc at the center of the disc and is rotatable along with the disc; and the motor is connected to the rotary shaft and rotates the rotary shaft under control of the controller. Therefore, the targets can be sequentially supplied to the chamber by rotating the disc on which the targets are arranged at equal intervals. Accordingly, periodic and continuous quantum beam generation can be realized by use of the disc on which the targets are arranged at equal intervals.

In the device for quantum beam generation according to the one aspect of the present invention, the driver comprises a sensor; the sensor detects the number of rotations of the rotary shaft and an axial position of the rotary shaft, and sends to the controller, rotation information indicative of the number of rotations and the axial position; the controller controls rotary motion of the disc, based on the rotation information; and the axial position is a position in a rotating direction of the rotary shaft. In this manner, the rotating state of the disc can be recognized by use of the sensor and thus the controller can rotate the disc in an optionally set period. Therefore, continuous quantum beam generation can be performed in the optionally set period.

In the device for quantum beam generation according to the one aspect of the present invention, the target supply unit comprises an emission assist; the emission assist is arranged above the emission hole and can press the target present at the emission hole toward the emission direction under control of the controller; the controller calculates a timing for pressing when the through hole of the disc overlaps with the emission hole with rotation of the disc, based on the rotation information, and sends press control information based on the timing for pressing, to the emission assist; and the press control information is information for controlling the emission assist so as to press the target at the timing for pressing. The target is forcibly emitted by the emission assist and thus it can avoid an event of failure in emission, despite arrival of the timing for emitting. Furthermore, since the target can be emitted at high speed, the target, when used as cooled at low temperature, can be supplied to the irradiation point within a short time while being maintained at the temperature.

A method for quantum beam generation according to one aspect of the present invention is one comprising: an emission step of emitting a target to induce quantum beam generation, to an inside of a chamber; an estimation step of estimating an irradiation point with laser light inside the chamber; a preparation step of preparing irradiation with the laser light; and an output step of outputting the laser light, wherein the emission step comprises emitting the target at a controllable timing for emitting, into a preset emission direction inside the chamber, wherein the estimation step comprises detecting a passing position of the target in a monitoring area, measuring an entrance time when the target enters the monitoring area and an exit time when the target exits the monitoring area, calculating the irradiation point using the passing position, and calculating a timing for arriving of the target at the irradiation point, using a width of the monitoring area, the entrance time, the exit time, and a distance from the monitoring area to the irradiation point, wherein the monitoring area is preliminarily set at a position where the monitoring area intersects with the emission direction inside the chamber, wherein the passing position indicates a position in a plane perpendicular to the emission direction, wherein the preparation step comprises enabling the laser light to be condensed at the irradiation point, and wherein the output step comprises outputting the laser light at the timing for arriving. In this manner, the target to induce the quantum beam generation reaction is supplied at the controllable timing for emitting to the inside of the chamber, motion of the target inside the chamber is monitored, and the target is irradiated with the laser light, based on the result of this monitoring. Therefore, the supply of the target and the irradiation of the target with the laser light are automatically carried out, so as to enable continuous quantum beam generation.

In the method for quantum beam generation according to the one aspect of the present invention, the emission step comprises sequentially emitting a plurality of the targets at periodic intervals. Therefore, it becomes feasible to implement periodic continuous quantum beam generation.

A device for laser fusion according to one aspect of the present invention is one comprising: a chamber for a target to induce a fusion reaction; a target supply unit that supplies the target to the chamber; a target monitor that monitors the target present inside the chamber; a laser light irradiator that irradiates the target present inside the chamber, with laser light; and a controller that controls the target supply unit and the laser light irradiator, based on the result of the monitoring by the target monitor, wherein the target supply unit comprises an emission port that emits of the target, and emits the target at a timing for emitting, that is controlled by the controller, into a preset emission direction inside the chamber from the emission port, wherein the target monitor comprises a position detector and a time detector, wherein the position detector detects a passing position of the target in a monitoring area and sends position information indicative of the passing position, to the controller, wherein the monitoring area is preliminarily set at a position where the monitoring area intersects with the emission direction inside the chamber, wherein the passing position indicates a position in a plane perpendicular to the emission direction, wherein the time detector measures an entrance time when the target enters the monitoring area and an exit time when the target exits the monitoring area, and sends entrance time information indicative of the entrance time and exit time information indicative of the exit time, to the controller, wherein the laser light irradiator comprises a laser light output unit and a condensing optical unit, wherein the laser light output unit outputs laser light under control of the controller, wherein the condensing optical unit condenses the laser light output from the laser light output unit, based on control by the controller, wherein the controller calculates an irradiation point with the laser light, using the position information, sends condensing control information based on the irradiation point to the condensing optical unit, calculates a timing for arriving of the target at the irradiation point, using a width of the monitoring area, the entrance time information, the exit time information, and a distance from the monitoring area to the irradiation point, and sends laser control information based on the timing for arriving, to the laser light output unit, wherein the condensing control information is information for controlling the condensing optical unit so as to condense the laser light from the laser light output unit to the irradiation point, wherein the laser control information is information for controlling the laser light output unit so as to output the laser light at the timing for arriving, and wherein a material of the target is a material containing a hydrogen isotope. In this manner, the target supply unit supplies the target to induce the fusion reaction, at the timing for emitting, that is controlled by the controller, to the inside of the chamber, the target monitor monitors motion of the target inside the chamber, and the controller implements the irradiation of the target with the laser light, based on the result of this monitoring. Therefore, the controller automatically implements the supply of the target and the irradiation of the target with the laser light, whereby continuous fusion reactions are enabled by the control by the controller.

Advantageous Effect of Invention

One aspect of the present invention can provide the device for quantum beam generation and the method for quantum beam generation, that are capable of implementing automatic, continuous quantum beam generation, and the device for laser fusion.

DESCRIPTION OF EMBODIMENTS

Figure 1:
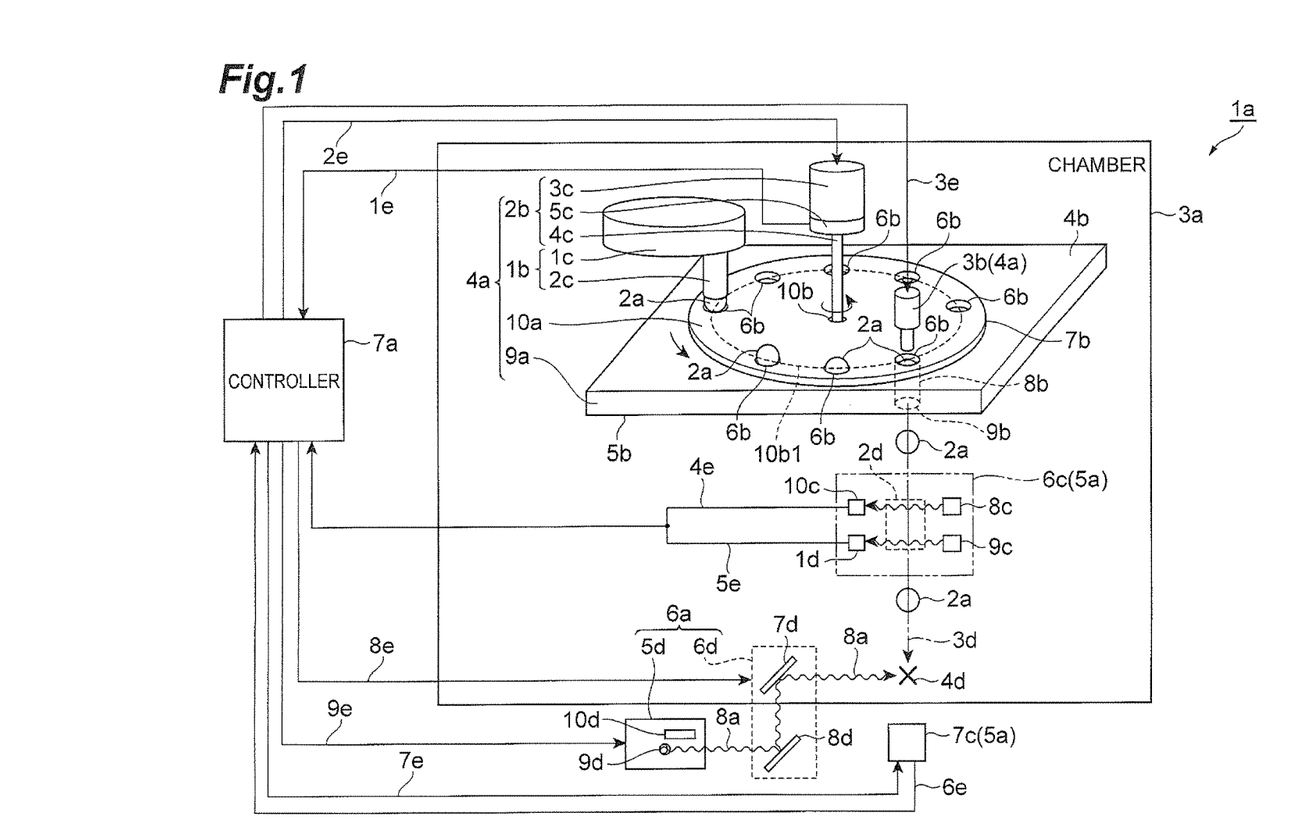
FIG. 1 is a drawing schematically showing a configuration of a device for quantum beam generation according to an embodiment.
Figure 2:
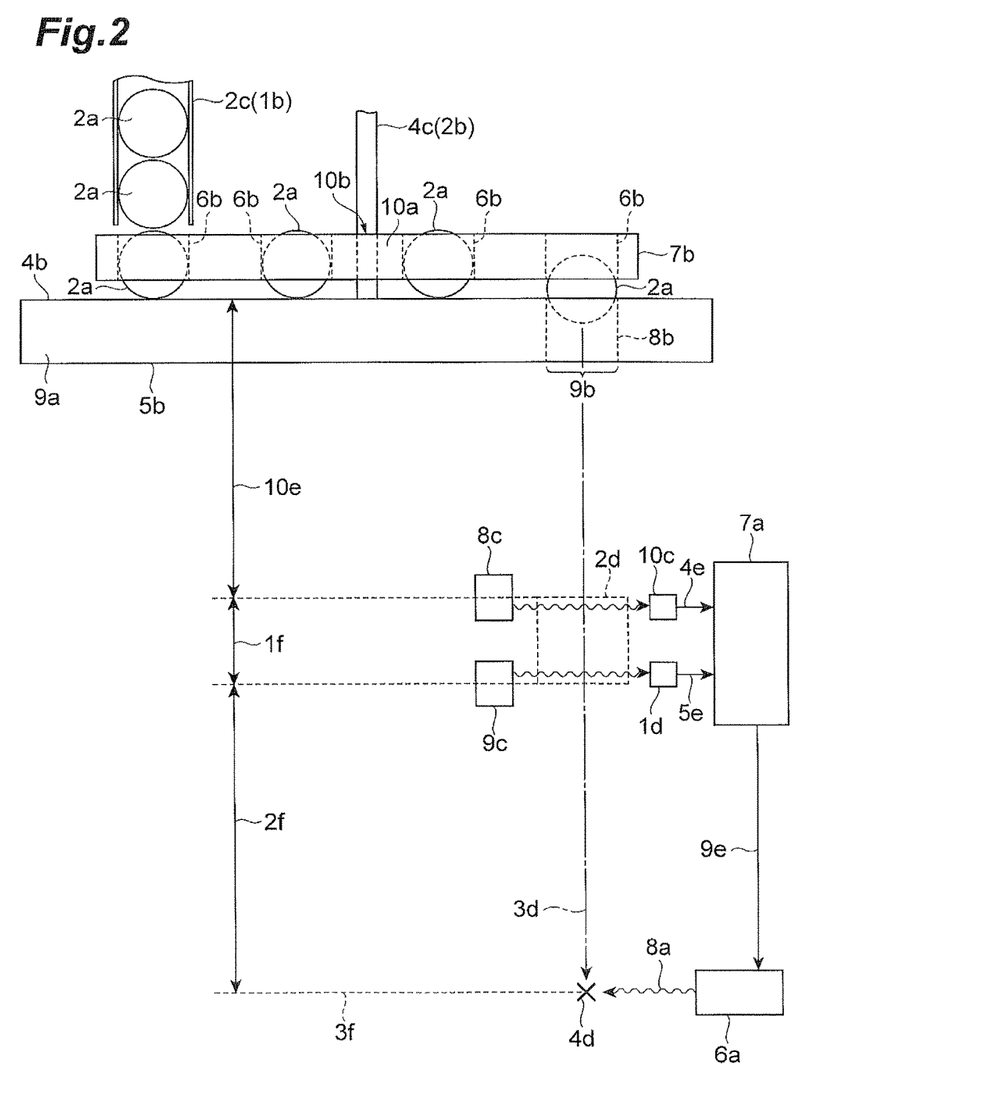
FIG. 2 is a drawing schematically showing the configuration of the device for quantum beam generation according to the embodiment.

Embodiments will be described below in detail with reference to the drawings. In the description of the drawings the same elements will be denoted by the same reference signs as much as possible, without redundant description. The configuration of quantum beam generation device $1a$ (device for quantum beam generation) according to an embodiment will be described with reference to FIGS. 1 and 2. FIGS. 1 and 2 are drawings both schematically showing the configuration of the quantum beam generation device $1a$.

The quantum beam generation device $1a$ has a chamber $3a$, a target supply unit $4a$, a target monitor $5a$, a laser light irradiator $6a$, and a controller $7a$. The chamber $3a$ defines a space where a target $2a$ induces a quantum beam generation reaction. The target supply unit $4a$ supplies the target $2a$ to the chamber $3a$. The target monitor $5a$ monitors the target $2a$ present inside the chamber $3a$. The laser light irradiator $6a$ irradiates the target $2a$ present inside the chamber $3a$, with laser light $8a$. The controller $7a$ controls the target supply unit $4a$ and the laser light irradiator $6a$, based on the result of monitoring by the target monitor $5a$.

The target supply unit $4a$ has an emission port $9b$ that emits the target $2a$. The target supply unit $4a$ supplies the target $2a$ at a timing for emitting, that is controlled by the controller $7a$, into a preset emission direction $3d$ inside the chamber $3a$ from the emission port $9b$.

The target supply unit $4a$ has a support table $9a$, a disc $10a$, a tank $1b$, and a driver $2b$. The support table $9a$ has a principal surface $4b$, a back surface $5b$, and an emission hole $8b$. The emission hole $8b$ has the diameter enough for the target $2a$ to pass. The emission hole $8b$ has the emission port $9b$. The emission hole $8b$ penetrates from the principal surface $4b$ to the back surface $5b$. The emission port $9b$ is an aperture on the back surface $5b$ side.

The disc $10a$ has a plurality of through holes $6b$ at preset intervals (e.g., at equal intervals) along the edge $7b$ of the disc $10a$. A center $10b$ of the disc $10a$ is held rotatable with respect to the principal surface $4b$ so that the through holes $6b$ can overlap with the emission hole $8b$. The through holes $6b$ can enclose the respective targets $2a$ on the principal surface $4b$.

The tank $1b$ has a main body $1c$ and a supply tube $2c$. The tank $1b$ is arranged above the disc $10a$. The main body $1c$ can store a plurality of targets $2a$. The supply tube $2c$ has the diameter enough for the target $2a$ to pass. The supply tube $2c$ is connected to the main body $1c$. The supply tube $2c$ is arranged above a circumference $10b1$ passing centers of all the through holes $6b$.

The driver $2b$ has a rotary shaft $4c$ and a motor $3c$. The rotary shaft $4c$ is fixed to the disc $10a$ at the center $10b$ of the disc $10a$ and is rotatable along with the disc $10a$. The motor $3c$ is connected to the rotary shaft $4c$. The motor $3c$ rotates the rotary shaft $4c$ under control of the controller $7a$.

The driver $2b$ has a sensor $5c$. The sensor $5c$ detects the number of rotations of the rotary shaft $4c$ and the axial position of the rotary shaft $4c$. The sensor $5c$ sends to the controller $7a$, rotation information $1e$ indicative of the number of rotations of the rotary shaft $4c$ and the axial position of the rotary shaft $4c$. The axial position of the rotary shaft $4c$ is a position in a rotating direction of the rotary shaft $4c$. In the present embodiment, information means electronic data that a CPU of the controller $7a$ can read.

The target supply unit $4a$ has an emission assist $3b$. The emission assist $3b$ is arranged above the emission hole $8b$. The emission assist $3b$ can press the target $2a$ present above the emission hole $8b$, toward the emission direction $3d$ under control of the controller $7a$. The emission assist $3b$ presses the target $2a$, for example, by ejecting gas toward the emission direction $3d$.

The target monitor 5a has a position detector 7c and a time detector 6c. The position detector 7c consists of, for example, one or more imaging devices (cameras). The position detector 7c detects a passing position of the target 2a in a monitoring area 2d and sends position information 6e indicative of this passing position to the controller 7a. The position detector 7c detects the passing position of the target 2a at a timing when the target 2a enters the monitoring area 2d, for example, based on entrance time information 4e. The monitoring area 2d is preliminarily set at a position where the monitoring area intersects with the emission direction 3d inside the chamber 3a. The passing position detected by the position detector 7c indicates a position in a plane perpendicular to the emission direction 3d (or in a plane parallel to a reference plane 3f shown in FIG. 2). The time detector 6c measures an entrance time when the target 2a enters the monitoring area 2d, and an exit time when the target 2a exits the monitoring area 2d.

The time detector 6c sends to the controller 7a, the entrance time information 4e indicative of the entrance time and exit time information 5e indicative of the exit time. The time detector 6c is, for example, a photosensor. The time detector 6c has a light emitting device 8c, a light emitting device 9c, a light receiving device 10c, and a light receiving device 1d. The light receiving device 10c receives light emitted from the light emitting device 8c. The light receiving device 1d receives light emitted from the light emitting device 9c. The light receiving device 10c converts the received light signal into an electric signal and sends this electric signal as entrance time information 4e to the controller 7a. The light receiving device 1d converts the received light signal into an electric signal and sends this electric signal as exit time information 5e to the controller 7a. The monitoring area 2d is defined by a travel path of the light emitted from the light emitting device 8c and a travel path of the light emitted from the light emitting device 9c. When the target 2a enters the monitoring area 2d, the electric signal (entrance time information 4e) output by the light receiving device 10c takes a value indicative of entrance of the target 2a into the monitoring area 2d. When the target 2a exits the monitoring area 2d, the electric signal (exit time information 5e) output by the light receiving device 1d takes a value indicative of exit of the target 2a from the monitoring area 2d. The light emitting device 8c and the light emitting device 9c both are, for example, light emitting diodes. The light receiving device 10c and the light receiving device 1d both are, for example, photodiodes. Here, the time detector 6c may be a plurality of imaging devices or an imaging device that is capable of high-speed photography.

The laser light irradiator 6a has a laser light output unit 5d and a condensing optical unit 6d. The laser light output unit 5d outputs laser light 8a under control of the controller 7a. The laser light output unit 5d has a laser light source 9d and a shutter 10d. The laser light source 9d emits the laser light at a repetition rate of several ten MHz, irrespective of laser control information 9e. The laser light output unit 5d selects laser pulses from a laser pulse train of pulse emissions at the repetition rate of several ten MHz, based on the laser control information 9e, and drives the shutter 10d. The laser light output unit 5d opens the shutter 10d with instructions of emission and closes the shutter 10d with instructions of no emission, based on the laser control information 9e.

The condensing optical unit 6d condenses the laser light 8a output from the laser light output unit 5d, based on control by the controller 7a. The condensing optical unit 6d has a plurality of mirrors, e.g., mirror 7d and mirror 8d. The condensing optical unit 6d moves arrangements, for example, of the mirror 7d and the mirror 8d, based on condensing control information 8e.

The controller 7a calculates a timing (timing for pressing) when each through hole 6b of the disc 10a overlaps with the emission hole 8b during rotation of the disc 10a, based on the rotation information 1e. The controller 7a sends press control information 3e based on the timing for pressing, to the emission assist 3b. The press control information 3e is information for controlling the emission assist 3b so as to press the target at the timing for pressing, that is calculated by the controller 7a.

The controller 7a controls the target supply unit 4a so as to sequentially emit a plurality of targets 2a at periodic intervals from the emission port 9b. The controller 7a controls the rotary motion of the disc 10a, based on the rotation information 1e.

The controller 7a calculates an irradiation point 4d with the laser light 8a, using the position information 6e. The irradiation point 4d is a point included in the reference plane 3f. The reference plane 3f is a plane a distance of which is constant from the principal surface 4b of the support table 9a (the distance is the sum of distance 10e, width 1f, and distance 2f) and which is perpendicular to the emission direction 3d. The controller 7a sends the condensing control information 8e based on the irradiation point 4d, to the condensing optical unit 6d. The controller 7a calculates a timing for arriving of the target 2a at the irradiation point 4d, using the width 1f of the monitoring area 2d, the entrance time information 4e, the exit time information 5e, and the distance 2f from the monitoring area 2d to the irradiation point 4d. The controller 7a sends the laser control information 9e based on the timing for arriving, to the laser light output unit 5d. The condensing control information 8e is information for controlling the condensing optical unit 6d so as to condense the laser light 8a from the laser light output unit 5d, to the irradiation point 4d. The laser control information 9e is information for controlling the laser light output unit 5d so as to output the laser light 8a at the timing for arriving, that is calculated by the controller 7a. All pieces of the information indicative of the distance 10e, the information indicative of the width 1f, and the information indicative of the distance 2f are preliminarily stored as electronic data in a memory of the controller 7a.

The diameter of the emission hole 8b is, for example, not less than 101% and not more than 120% of the diameter of the target 2a. The diameter of the supply tube 2c is, for example, not less than 101% and not more than 120% of the diameter of the target 2a. The controller 7a implements emissions of the targets 2a, for example, in the range of not less than 10 Hz and not more than 100 Hz. The emission assist 3b can set the initial velocity of the target 2a upon emission from the emission port 9b, for example, in the range of not less than several m/s and not more than several hundred m/s. The emission assist 3b ejects gas toward the emission direction 3d, for example, only in a period of not less than several ms and not more than several hundred ms, so as to press the target 2a. The distance 10e is, for example, approximately 80 mm, the width 1f, for example, approximately 40 mm, and the distance 2f, for example, approximately 60 mm.

Figure 3:
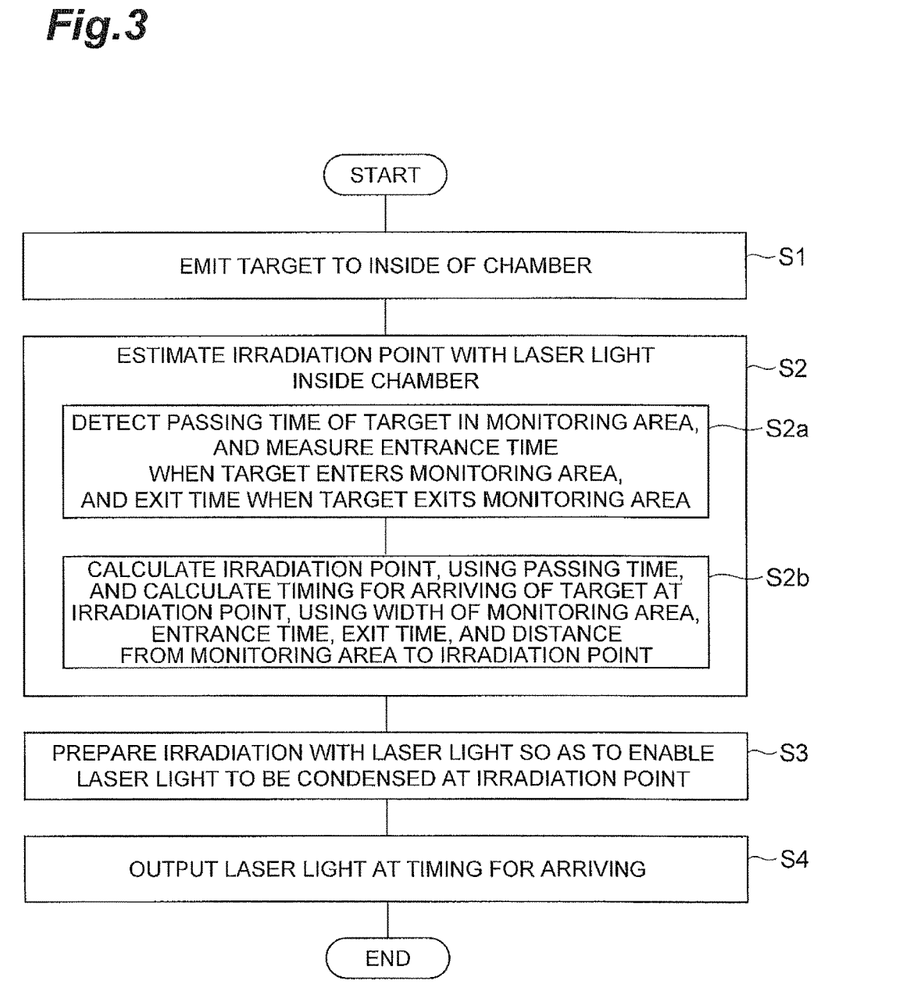
FIG. 3 is a flowchart for explaining a method for quantum beam generation according to an embodiment.

A method for quantum beam generation according to an embodiment will be described with reference to FIG. 3. First, in step S1 (emission step), the controller 7a controls the target supply unit 4a to emit the target 2a to the inside of the chamber 3a. In step S1, the controller 7a controls the target supply unit 4a to emit the target 2a at the timing for emitting, that can be controlled by the controller 7a, into the preset emission direction 3d inside the chamber 3a.

After step S1, step S2 (estimation step) is carried out so that the controller 7a estimates the irradiation point 4d with the laser light 8a inside the chamber 3a. The step S2 consists of step S2a and step S2b.

In step S2a, the position detector 7c detects the passing position of the target 2a in the monitoring area 2d. In step S2a, the time detector 6c measures the entrance time when the target 2a enters the monitoring area 2d, and the exit time when the target 2a exits the monitoring area 2d.

After step S2a, step S2b is carried out so that the position detector 7c calculates the irradiation point 4d, using the passing position detected by the position detector 7c. In step S2b, the position detector 7c calculates the timing for arriving of the target 2a at the irradiation point 4d, using the width 1f of the monitoring area 2d, the entrance time information 4e indicative of the entrance time, the exit time information 5e indicative of the exit time, and the distance 2f from the monitoring area 2d to the emission point 4d.

After step S2, step S3 (preparation step) is carried out so that the controller 7a controls the condensing optical unit 6d to move the irradiation position with the laser light 8a so as to condense the laser light 8a at the irradiation point 4d, thereby preparing the irradiation. After step S3, step S4 (output step) is carried out so that the controller 7a controls the laser light output unit 5d to output the laser light 8a at the arrival time calculated in step S2b.

Figure 4:
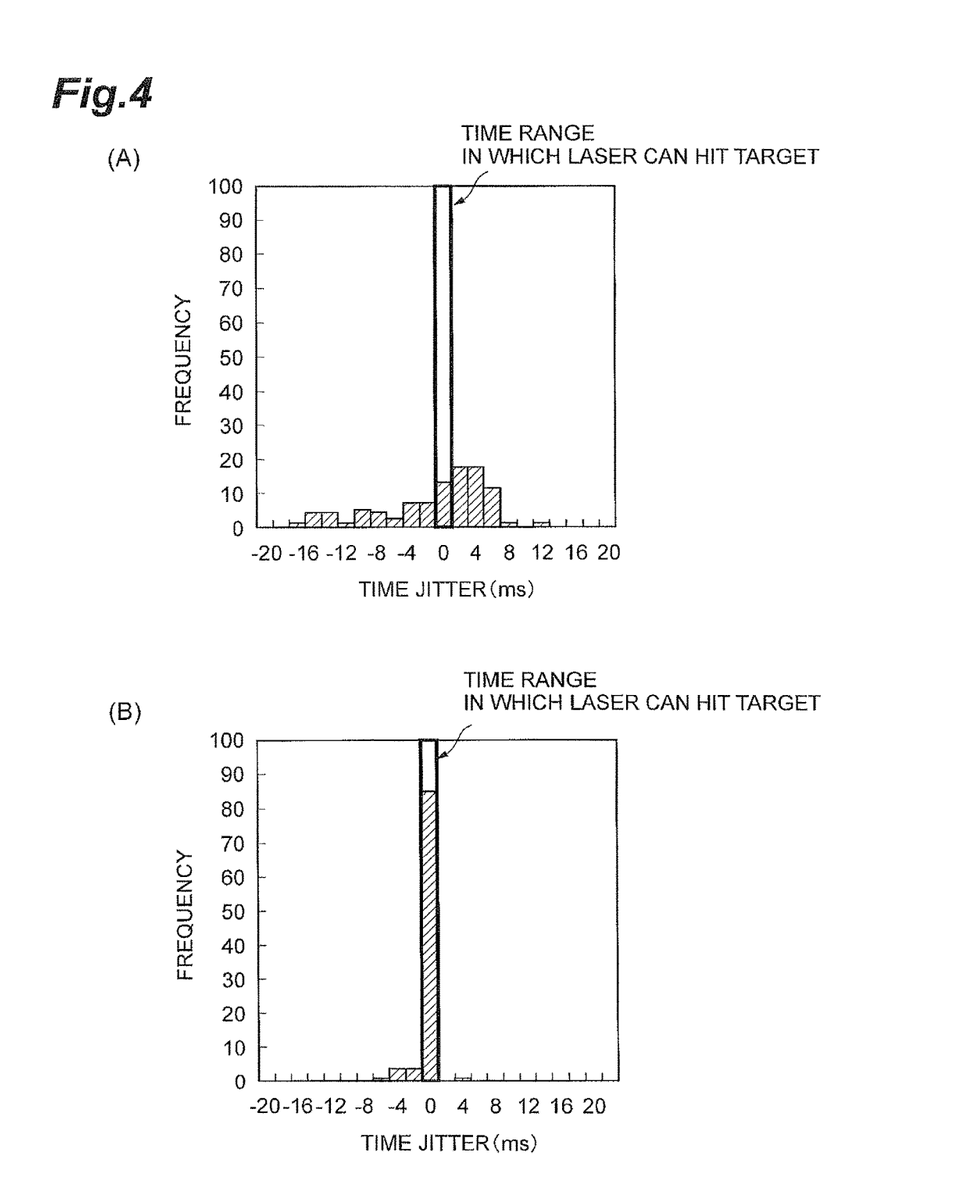
FIG. 4 is a drawing for explaining an effect of the device for quantum beam generation according to the embodiment.

FIG. 4 is a drawing for explaining the effect of the quantum beam generation device according to the embodiment. The horizontal axis in part (A) of FIG. 4 and the horizontal axis in part (B) of FIG. 4 both represent time jitter (ms). The time jitter shown in FIG. 4 is a value obtained by subtracting the passing time of the target 2a at the irradiation point 4d from the irradiation time thereof with the laser light 8a. The vertical axis in part (A) of FIG. 4 and the vertical axis in part (B) of FIG. 4 both represent frequency (event count). Part (A) of FIG. 4 is the measurement result obtained, particularly, without use of the laser control information 9e in the quantum beam generation device 1a. Part (B) of FIG. 4 is the measurement result of the quantum beam generation device 1a (particularly, the measurement result obtained with use of the laser control information 9e). It is understood from the measurement results shown in FIG. 4 that the quantum beam generation device 1a using the laser control information 9e shows the higher frequency of events that the irradiation time with the laser light 8a is approximately coincident with the passing time of the target 2a at the irradiation point 4d (or that the time jitter is zero) than the quantum beam generation device 1a not using the laser control information 9e. When the time jitter is zero, the laser light 8a is irradiated onto the target 2a. The target 2a to be used can be a shell or a bead containing Li or Be. When the shell or bead containing Li or Be is used as a target, the device can generate a quantum beam of neutrons, protons, ions, or the like.

In this manner, the target 2a to induce the quantum beam generation reaction is supplied at the timing for emitting, that is controlled by the controller 7a, to the inside of the chamber 3a by the target supply unit 4a, the motion of the target 2a inside the chamber 3a is monitored by the target monitor 5a, and the controller 7a implements the irradiation of the target 2a with the laser light 8a, based on the result of this monitoring. Therefore, the supply of the target 2a and the irradiation of the target 2a with the laser light 8a are automatically carried out by the controller 7a, whereby continuous quantum beam generation is enabled by the control by the controller 7a.

By the control by the controller 7a, it becomes feasible to implement periodic continuous quantum beam generation.

By rotating the disc 10a on which the targets 2a are arranged at equal intervals, the targets 2a can be sequentially supplied to the chamber 3a. Therefore, periodic and continuous quantum beam generation can be realized with the use of the disc 10a on which the targets 2a are arranged at equal intervals.

Since the controller 7a can recognize the rotating state of the disc 10a by use of the sensor 5c, the disc 10a can be rotated in an optionally set period. Therefore, it becomes feasible to implement continuous quantum beam generation in the optionally set period.

Since the target 2a is forcibly emitted by the emission assist 3b, it allows us to avoid such an event that no emission is implemented despite arrival of the timing for emitting. Furthermore, since the target can be emitted at high speed, the target, when used as cooled at low temperature, can be supplied to the irradiation point within a short time while maintained at the temperature.

The principle of the present invention was shown and described above with the preferred embodiments, and it is to be understood by those skilled in the art that the present invention can be modified in arrangement and details without departing from the principle. The present invention is by no means intended to be limited to the specific configurations disclosed in the embodiments. Therefore, rights are claimed to all corrections and modifications coming from the scope of claims and the scope of spirit thereof. For example, any one or all of the target supply unit 4a, the time detector 6c, and the laser light irradiator 6a can be arranged outside the chamber 3a.

A plurality of laser light output units 5d may be arranged so that the target can be irradiated simultaneously or with time difference. When a material of the target is a pellet filled with a solid hydrogen isotope (deuterium or tritium) cooled at extremely low temperature, a pellet filled with a gas hydrogen isotope, or a plastic bead or plastic shell whose hydrogen is replaced with a hydrogen isotope, the quantum beam generation device of the embodiment can serve as a laser fusion device (a device for laser fusion). When the device is used as a laser fusion device, the target supply unit 4a is arranged in an extremely-low-temperature bath in a thermally insulated state from the chamber 3a, whereby the target cooled at low temperature can be supplied. In this manner, the embodiment can provide the device for laser fusion and method for fusion generation, that are capable of implementing automatic continuous fusion reactions.

INDUSTRIAL APPLICABILITY

The present invention is applicable to the device for quantum beam generation, the method for quantum beam generation, and the device for laser fusion capable of implementing the automatic continuous quantum beam generation.

REFERENCE SIGNS LIST

1a . . . quantum beam generation device; 2a . . . target; 3a chamber; 4a . . . target supply unit; 5a . . . target monitor; 6a . . . laser light irradiator; 7a . . . controller; 8a . . . laser light; 9a . . . support table; 10a . . . disc; 1b . . . tank; 2b . . . driver; 3b . . . emission assist; 4b . . . principal surface;

5b . . . back surface; 6b . . . through hole; 7b . . . edge; 8b . . . emission hole; 9b . . . emission port; 10b . . . center; 1c . . . main body; 2c . . . supply tube; 3c . . . motor; 4c . . . rotary shaft; 5c . . . sensor; 6c . . . time detector; 7c . . . position detector; 8c . . . light emitting device; 9c . . . light emitting device; 10c . . . light receiving device; 1d . . . light receiving device; 2d . . . monitoring area; 3d . . . emission direction; 4d . . . irradiation point; 5d . . . laser light output unit; 6d . . . condensing optical unit; 7d . . . mirror; 8d mirror; 9d . . . laser light source; 10d . . . shutter; 1e . . . rotation information; 2e . . . rotation control information; 3e . . . press control information; 4e . . . entrance time information; 5e . . . exit time information; 6e . . . position information; 7e . . . imaging control information; 8e . . . condensing control information; 9e . . . laser control information; 10e . . . distance; 1f . . . width; 2f . . . distance; 3f . . . reference plane.

The invention claimed is:

1. A device for quantum beam generation, comprising:
a chamber for a target to induce a quantum beam generation reaction;
a target supply unit that supplies the target to the chamber;
a target monitor that monitors the target present inside the chamber;
a laser light irradiator that irradiates the target present inside the chamber, with laser light; and
a controller that controls the target supply unit and the laser light irradiator, based on the result of the monitoring by the target monitor,
wherein the target supply unit comprises an emission port that emits the target, and emits the target at a timing for emitting, that is controlled by the controller, into a preset emission direction inside the chamber from the emission port,
wherein the target monitor comprises a position detector and a time detector,
wherein the position detector detects a passing position of the target in a monitoring area and sends position information indicative of the passing position, to the controller,
wherein the monitoring area is preliminarily set at a position where the monitoring area intersects with the emission direction inside the chamber,
wherein the passing position indicates a position in a plane perpendicular to the emission direction,
wherein the time detector measures an entrance time when the target enters the monitoring area and an exit time when the target exits the monitoring area, and sends entrance time information indicative of the entrance time and exit time information indicative of the exit time, to the controller,
wherein the laser light irradiator comprises a laser light output unit and a condensing optical unit,
wherein the laser light output unit outputs laser light under control of the controller,
wherein the condensing optical unit condenses the laser light output from the laser light output unit, based on control by the controller,
wherein the controller calculates an irradiation point with the laser light, using the position information, sends condensing control information based on the irradiation point to the condensing optical unit, calculates a timing for arriving of the target at the irradiation point, using a width of the monitoring area, the entrance time information, the exit time information, and a distance from the monitoring area to the irradiation point, and sends laser control information based on the timing for arriving, to the laser light output unit,
wherein the condensing control information is information for controlling the condensing optical unit so as to condense the laser light from the laser light output unit to the irradiation point,
wherein the laser control information is information for controlling the laser light output unit so as to output the laser light at the timing for arriving,
wherein the target supply unit comprises a support table, a disc, a tank, and a driver,
wherein the support table comprises a principal surface, a back surface, and an emission hole,
wherein the emission hole has a diameter enough for the target to pass, has the emission port, and penetrates from the principal surface to the back surface,
wherein the disc comprises a plurality of through holes at preset intervals along an edge of the disc,
wherein a center of the disc is held rotatable with respect to the principal surface so that the through hole can overlap with emission hole,
wherein the through holes can enclose the targets on the principal surface,
wherein the tank comprises a main body and a supply tube and is arranged above the disc,
wherein the main body can store a plurality of the targets,
wherein the supply tube has a diameter enough for the target to pass, is connected to the main body, and is arranged above a circumference passing centers of all the through holes,
wherein the driver comprises a rotary shaft and motor,
wherein the rotary shaft is fixed to the disc at the center at the disc and is rotatable along with the disc,
wherein the motor is connected to the rotary shaft and rotates the rotary shaft under control of the controller,
wherein the driver comprises a sensor,
wherein the sensor detects the number of rotations of the rotary shaft and a rotational position of the rotary shaft, and sends to the controller, rotation information indicative of the number of rotations and the rotational position,
wherein the controller controls rotary motion of the disc based on the rotation information,
wherein the target supply unit comprises an emission assist,
wherein the emission assist is arranged above the emission hole can press the target present at the emission hole toward the emission direction under control of the controller,
wherein the controller calculates a timing for pressing when the through hole of the disc overlaps with the emission hole with rotation of the disc, based on the rotation information, and sends press control information based on timing for pressing, to the emission assist, and
wherein the press control information is information for controlling the emission assist so as to press the target at the timing for pressing.

2. The device for quantum beam generation according to claim 1, wherein the controller controls the target supply unit so as to sequentially emit a plurality of the targets at periodic intervals from the emission port.

* * * * *